Aug. 18, 1964 A. R. HUTSON 3,145,354

CIRCUIT ELEMENT

Filed April 20, 1960

INVENTOR
A. R. HUTSON
BY George S. Indig
ATTORNEY

United States Patent Office 3,145,354

Patented Aug. 18, 1964

3,145,354
CIRCUIT ELEMENT

Andrew R. Hutson, Plainfield, N.J., assignor to Bell Telephone Laboratories, Incorporated, New York, N.Y., a corporation of New York Filed Apr. 20, 1960, Ser. No. 23,441
2 Claims. (Cl. 333—30)

Figures 1, 2:
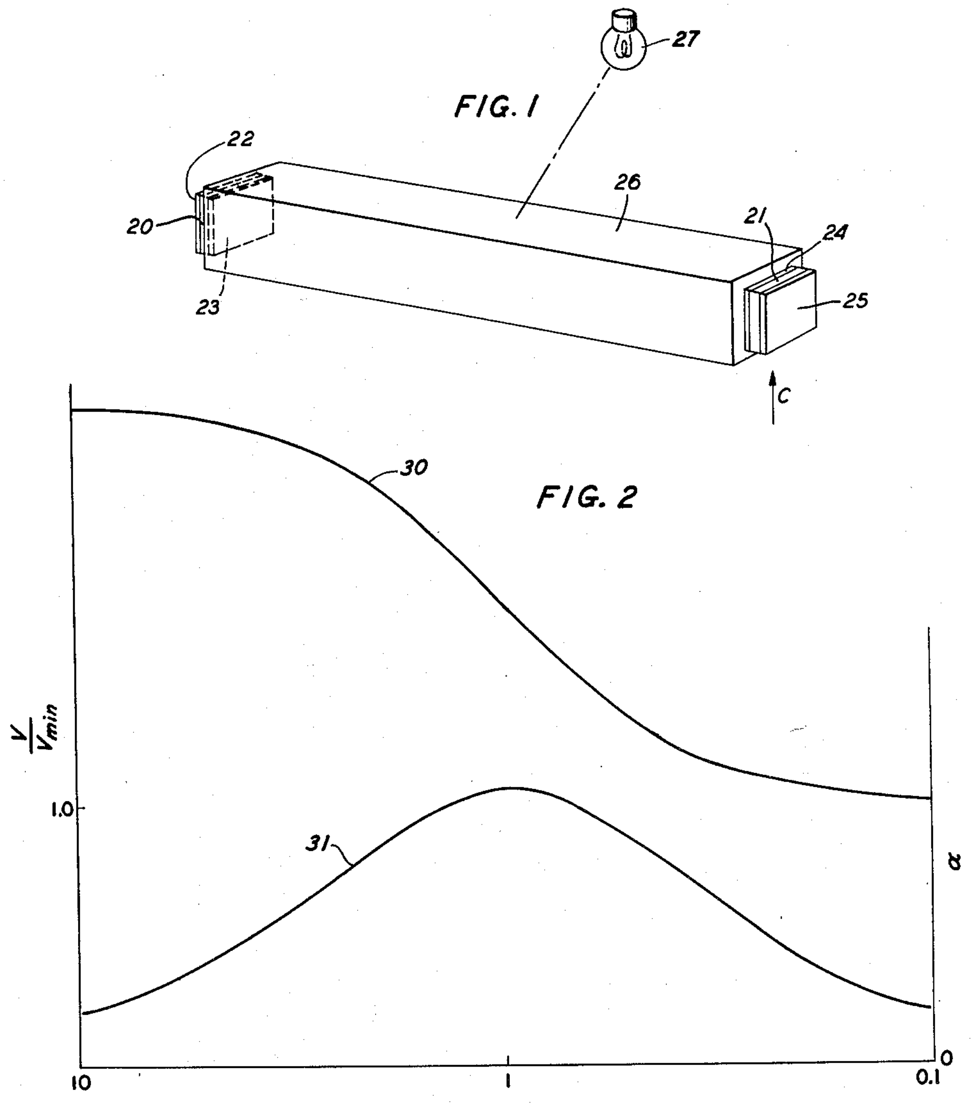

This invention relates to new electromechanical circuit elements. An exemplary class of circuit elements of this invention makes use of a conductivity-modulable piezoelectric material through which an ultrasonic path is defined.

In one form, the devices of this invention resemble a class of prior art devices known as ultrasonic delay lines, and certain of the devices herein may serve a similar function. In its classical form, an ultrasonic delay line may be represented as a rod-shaped delay element of a good material (high modulus, chemically stable) intermediate and in juxtaposition with two piezoelectric transducers. The transducers are each provided with a pair of electrodes and are arranged relative to the delay element such that impressing an electrostatic field across one results in a mechanical movement which is transmitted through the delay element and so impressed on the second transducer, in turn producing an electrostatic field of a frequency corresponding with that impressed across the first transducer. The delay introduced into the circuit is dependent on the velocity through the delay element. Early delay lines operating on this principle generally made use of a longitudinal vibrational mode so that the total delay introduced was dependent upon the dimension of the delay element intermediate the two transducers. Later designs made use of more complex shear modes and so made possible a longer delay time for a given element size. (See U.S. Patent 2,839,731.) Typically, delay lines of this class make use of a delay element of fused silica and quartz or barium titanate transducers.

In a limited aspect, devices of this invention may serve also as ultrasonic delay lines. In this use, substitution of a conductivity-modulable delay element material having piezoelectric characteristics for the fused silica or other material ordinarily used results in a controllably variable parameter which may, through conductivity modulation, take the form of a variation in delay time or phase shifting.

The variation in delay so introduced into the delay element is considered to be a relaxation phenomenon. Consistent with this hypothesis, it has been observed that the velocity variation is accompanied by an attenuation peak, the maximum point of which occurs approximately at the steepest portion of the velocity variation curve. The presence of this attenuation peak, which may be varied also in terms of frequency and/or conductivity, suggests uses which far transcend that of the traditional delay element. The peak, which may be considered to be approximately two orders of magnitude wide in terms of frequency and which may have a maximum attenuation value of the order of forty or fifty times its minimum asymptotic value, suggests a class of switching devices, switching being brought about by a sharp attenuation in ultrasonic vibrations corresponding with a change in conductivity or frequency. The presence of the peak and its fairly regular slope over portions of the curve suggest an additional class of devices in which ultrasonic waves are amplitude modulated by means of a corresponding variation in conductivity. The presence of the peak, too, suggests a class of rejection filter devices. In this class of devices, the frequency or frequencies rejected may be fixed or varied in any desired manner for concomitant variations in conductivity. Band pass filter arrangements, also fixed or variable in frequency, or in this instance in band width, result from classical combinations of any of the rejection filter devices of this invention or may be produced in a single device in accordance with any of the various techniques discussed herein.

Thus far, the description has been in terms of the conductivity-modulable piezoelectric ultrasonic delay element. Although various mechanisms for modulating conductivity in such elements are known, it has been found most expeditious to operate with any of that class of piezoelectric materials also evidencing photoconductivity, and in general such materials, of which cadmium sulfide is exemplary, are preferred for the purposes of this invention. It is a general characteristic of materials of this class that conductivity variations due to this effect are fairly rapid, generally evidencing relaxation times of the order of a very few milliseconds. Further, the degree of conductivity introduced through the photo effect is, for preferred compositions, sufficient to damp out any piezoelectric field which may exist. For many compositions this damping may be brought about with only a relatively small change in illumination level, so resulting in sensitive devices rapidly and sharply responding to small variations in illumination. It should be understood, however, that, although light-modulable conductivity mechanisms are preferred for these purposes, it is recognized that the relaxation phenomenon to which the devices of this invention owe their existence is common to other conductivity-modulating mechanisms including, for example, beta or other particulate radiation and temperature variations. It should be understood, too, that, although much of the discussion herein is in terms of varying conductivity by the use of light or other means, it is contemplated that devices of this invention may take the form of fixed or adjustable, rather than variable, conductivity devices operating as filters or other devices dependent upon the existence of a velocity change or attenuation under a particular set of static conditions.

In its broadest form, therefore, the present invention contemplates the use of an ultrasonic transmission element constructed of a material having piezoelectric properties. From the nature of the devices, it is seen that the piezoelectric ultrasonic element should be so oriented that a mechanical wave propagated through it and being introduced by a piezoelectric transducer produces an electrostatic field within the transmission element during passage. To operate as a fixed or variable filter or modulator, it is also required that the composition and other elemental conditions be such that an attenuation peak is produced at a desired frequency or over a desired frequency range.

Fortunately, the literature includes reports of studies directed to determining the photoconductive properties of certain materials within the exemplary class most suitable for these devices. Insofar as pertinent, the data reported takes the form of light and dark resistivities or conductivities for various compositions. Allusion is made to some of this literature. It is well known by workers in this art that the light and dark resistivities, as well as the illumination level necessary to produce change, may all be varied over a broad range by inclusion of small amounts of various activator materials. This work is sufficiently well documented so that a worker in the art with little or no experimentation can select a composition manifesting appropriate ranges and also minimum and maximum values of resistivity. It is known, too, that relaxation times in such photoresistive materials may be varied by use of appropriate amounts of certain additive materials. Other related art that is found useful in the design of the devices herein includes that relative to the spectral response of materials satisfactory for these purposes, as well as related data such as absorption length, relaxation time, et cetera.

In being directed to photoconductive effects, and contemplating the use of the subject materials only in photocells, this literature is, of course, not concerned with the novel effects reported herein and therefore makes no reference to shift in velocity, to phase shifting, or to attenuation as related to ultrasonic frequency or electrical conductivity. To make direct use of the reported information it was necessary to develop relationships in terms of resistivity and other known physical characteristics of any of the materials to be incorporated. For convenience, this description is largely in terms of such relationships. Using these equations a person skilled in the art may design any of the devices herein including desired characteristics of suitable piezoelectric delay materials. Finally, referring to the literature (exemplary citations are included) suitable compositions having the requisite characteristics are specified.

The only other type of information required for device design requires a knowledge of the various electrical parameters germane to circuit use. Where the device is to serve as a delay line per se, however, utilizing any of the unique features of the delay lines of this invention, suitable delay dimensions and considerations pertinent to the design of the piezoelectric transducers per se are similar to those which are taken into account in the design of conventional delay lines. Design of devices serving other functions, e.g., rejection filters, band pass filters and the like, makes use of design conventions well known to workers in the appropriate field. All such design considerations are considered orthodox and not a necessary part of this description. The design of a particular piezoelectric delay element, since it must be so oriented as to result in generation of an electric field resulting from ultrasonic transmission, requires a knowledge of the crystallographic nature of the particular material chosen. Of course, the fundamental requirement is simple. It is necessary only that propagation be in such direction as to produce a piezoelectric field and that the field have a component in the direction of propagation. Such considerations are well documented for any of the common piezoelectric materials. For any new material, these characteristics are predictable on the basis of the crystallographic nature of the material itself. Cadmium sulfide, a particularly suitable material for these purposes by reason of its light-modulable conductivity mechanism, is described in my copending application Serial No. 22,015, filed April 13, 1960, now U.S. Patent 3,093,758.

Figure 3:
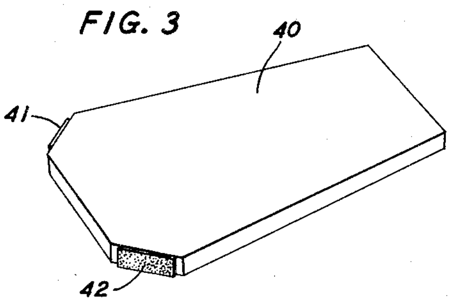

The remainder of the description is largely directed to the relationship between material characteristics and device characteristics for various categories of devices. This discussion is facilitated by reference to the drawing, in which:

FIG. 1 is a perspective view of a device which may serve as an ultrasonic delay line utilizing a piezoelectric delay material which may manifest a light-modulable conductivity mechanism;

FIG. 2 is a plot containing a first curve showing velocity change and a second curve showing attenuation, both as plotted in abscissa ordinate units indicative of the relationship between either of these characteristics and either ultrasonic frequency or electrical conductivity; and FIG. 3 is a perspective view of a device utilizing a delay line type of configuration in which the delay crystal and transducer orientations are such that ultrasonic transmission is chiefly by shear mode, so resulting in an increased delay for given device dimensions.

Although the invention contemplates a large category of specified and unspecified circuit elements, it is a common characteristic of all such elements that use is made of either a change in ultrasonic velocity or a variation in attenuation. It is the nature of certain of these devices that given ultrasonic velocity points or attenuation points are fixed in terms of frequency and/or conductivity. It is the nature of certain others that one or the other is varied or adjusted over a range or combination of either or both determinants. In any event, it is first necessary to consider the relationship between the properties of the piezoelectric delay material and ultrasonic velocity or attenuation. To expedite the mathematical development, reference is made to W. P. Mason, "Piezoelectric Crystals and Their Application to Ultrasonics," D. Van Nostrand Co. (1950).

It is convenient to consider the crystal properties in terms of a constant defined as follows:

$$A=\frac{4\pi e^2}{\epsilon^S C^E} \qquad (1)$$

where $e$ is the piezoelectric constant appropriate to the desired mode of wave motion as defined in Mason, supra, page 452 expressed in terms of cgs. electrostatic units (stat coulombs per square centimeter)—see Mason, supra, page 20 for units; $\epsilon^S$ is the dielectric constant for the material at constant strain; and $C^E$ is the appropriate elastic constant for constant electric field in units of dynes per square centimeter.

The variation in ultrasonic velocity may be considered in terms of equivalent "stiffness" of the material. "Stiffness" in turn may be considered as a measure of the energy required to physically deform a body by a given amount. It follows that superimposing a piezoelectric effect on a given physical material, due to the amount of energy required to create the piezoelectric field, results in increasing the "stiffness." It follows that this increase in "stiffness" results in an increase in the velocity and, therefore, a decrease in the ultrasonic delay. Increasing the electrical conductivity results in shorting out at least a portion or the piezoelectric field and so reduces the "stiffness" ultimately to the non-piezoelectric value for the material resulting in a decrease in ultrasonic velocity and an increase in delay time. The relationship between A and the limiting values of velocity is set forth:

$$A=\frac{v_{max}^2-v_{min}^2}{v_{min}^2} \qquad (2)$$

where $v$=ultrasonic velocity in cms./sec.

The relationship between A and attenuation is set forth:

$$\alpha=\frac{\omega A}{2v} \qquad (3)$$

where $\alpha$=the absorption constant in $cm.^{-1}$ such that the ultrasonic intensity in a wave traveling in the $+x$ direction decreases in intensity according to the law $I=I_0 \exp. (-\alpha x)$, where $I$=ultrasonic intensity and $I_0$=ultrasonic intensity at $x=0$;

$\omega=2\pi f$; and $v$ is as defined above, all in compatible cgs. units.

The position of maximum attenuation or maximum rate change in velocity occurs at the point:

$$\omega\tau=1 \qquad (4)$$

where $\omega=2\pi f$ in $sec.^{-1}$;

$\tau$=dielectric relaxation time in seconds;

$$=\frac{\epsilon^S}{4\pi\sigma}$$

where $\sigma$=conductivity in reciprocal stat ohm-cm.

Values of A have been calculated for cadmium sulfide and zinc oxide. For cadmium sulfide, A is equal to 0.06 for a longitudinal wave propagating along the C-axis and about 0.03 for a shear wave propagating perpendicular to the C-axis where material motion is along the C-axis. For zinc oxide, the equivalent longitudinal value of A is 0.11 and the shear value about 0.05. The values of $v$ of course vary with crystal direction. For the longitudinal direction in cadmium sulfide, $v$ is equal to $4.3\times10^5$ cm./sec.; for zinc oxide, about $6\times10^5$ cm./sec. For shear propagation, $v$ is equal to $1.75\times10^5$ cm./sec. in cadmium sulfide and about $2.5\times10^5$ cm./sec. in zinc oxide.

Referring again to the drawing, FIG. 1 depicts a classical ultrasonic delay device which may be operated either in shear or longitudinal mode. The device consists of piezoelectric elements 20 and 21, element 20 being provided with deposited electrodes 22 and 23 and element 21 being similarly provided with electrodes 24 and 25. Piezoelectric transducers 20 and 21 are cemented or otherwise affixed to delay element 26, which is made of a conductivity-modulable piezoelectric material. Crystallographic orientations are determined by the particular materials of which the transducers 20 and 21 and the delay element 26 are made. Considering zinc oxide transducers and a cadmium sulfide delay element, for a device operating in shear mode, the crystallographic *c* axis of each of the three elements lies in a plane parallel to the plane of either of the transducer plates 20 or 21. In operation, a signal impressed across, for example, leads 22 and 23 of element 20 results in a field produced in the 1 direction across that element, so producing shear in the 1–3 plane, both in that element, in delay element 26, and finally in transducer element 21. This shear in element 21 results in a piezoelectric field across electrodes 24 and 25 of a frequency corresponding with that initially impressed across electrodes 22 and 23.

One class of devices may make use of an adjustment or variation in conductivity to produce a concomitant frequency variation for any of the effects noted. Considering cadmium sulfide or other light conductivity-modulable piezoelectric material, use may be had of a light source 27 which, through varying illumination intensity, varies conductivity and so shifts the velocity and attenuation curves accordingly.

FIG. 2 includes two curves, 30 and 31, both plotted on abscissa units of $$\frac{\omega\epsilon^S}{4\pi\sigma}$$

in cgs. electrostatic units. For a given material, $\epsilon^S$ is fixed, so that the only variables in abscissa units are frequency and conductivity. Curve 30 is plotted on ordinate units of $v/v_{min}$, where $v$ is velocity in cm./sec. and $v_{min}$ is the minimum velocity which can be attained by increasing conductivity or decreasing frequency in the same units. Curve 31 is the corresponding attenuation curve in terms of $\alpha$ (Eq. 3 above) in units of cm.$^{-1}$. As discussed, the maximum rate of velocity change (Curve 30) and the peak of the attenuation (Curve 31) both occur at a value of $\omega\tau=1$ $$\left(\text{equal to } \frac{\omega\epsilon^S}{4\pi\sigma}\right)$$

It may be noted that the abscissa values are plotted logarithmically and that essentially the entire effect, be it in velocity change or attenuation variation, occurs in about two orders of magnitude change in abscissa units. In terms of filter design, it may, therefore, be considered that the change takes place over approximately two orders of magnitude in frequency. Of course, with appropriate circuitry, the frequency response may be sharpened by designing a circuit sensitive to a somewhat lesser change in attenuation. Of the order of half of the total change takes place in less than one order of magnitude frequency shift. Where it is desired to amplitude-modulate an ultrasonic signal, one may operate over either the left-hand or right-hand regions separated by the peak attenuation point at $\omega\tau=1$ on Curve 31. As discussed herein, any operating point may be chosen for any given condition of illumination or other conductivity modulating mechanism by choosing the appropriate piezoelectric composition.

FIG. 3 is a long delay time compact ultrasonic delay line, the prototype of which is described in U.S. Patent 2,839,731, issued to H. J. McSkimin on June 17, 1958. The device consists of piezoelectric delay element 40 and piezoelectric transducers 41 and 42, each equipped with face electrodes, not shown. The device makes use of shear mode ultrasonic transmission over a complex path and requires a piezoelectric axis in each of the three elements 40, 41 and 42 normal to a large flat surface of element 40. As in classical ultrasonic delay lines, the shear mode device of FIG. 3 is advantageous where it is desired to include a maximum acoustic transmission path in a device of a given size.

Where it is desired to use this element by reason of its variable delay by modulating conductivity and since the maximum percentage delay introducible through this mechanism is fixed by the nature of the material chosen, use of a longer path permits a greater absolute number of cycles to be delayed at a given frequency. Although suitable modulable piezoelectric materials for these purposes are available in fairly large crystal sizes, the expense involved in producing substantially larger crystals by present techniques and/or the need for space conservation may dictate use of such shear mode devices. In general, where the device is to operate as a simple rejection filter, or as a means for modulating an ultrasonic signal, simple configurations utilizing compressional modes suffice since the relative attenuation values and relative velocity times are not altered by path length.

Various considerations must be taken into account in the design of actual elements. Fortunately, suitable basic information for some materials is available in the literature. It is apparent that, since both the ultrasonic velocity and attenuation values vary with conductivity, the conductivity states for any condition should generally be as nearly uniform as possible; so where a sharp attenuation path or velocity change is desired, regardless of whether the conductivity is maintained static or is adjusted or varied during use, and where the conductivity is a function of composition, it is desirable that the composition be homogeneous. In light-modulable conductivity materials where use is made of small amounts of sensitizers to vary spectral response, conductivity or relaxation time, this is particularly important in a low conductivity or lighted state. Also, where this mechanism is utilized, attention must be given to the spectral response of whatever composition is chosen to arrive at a compromise light source emitting energy of a reasonably long absorption length which is also a reasonably high carrier generator.

Although it is realized that this information is already in the literature, it might be well to comment on the fact that desired operating conditions might well dictate use of a source emitting energy of relatively long absorption length even where the configuration might indicate that a short absorption length material would suffice. This is based on the fact that response time increases substantially as the inverse of absorption length. In cadmium sulfide, for example, use of a light source emitting a frequency substantially above of the order of 5200 A. wavelengths may result in virtually complete absorption within a depth of the order of $10^{-3}$ to $10^{-5}$ cm. and response times ranging up to of the order of a day. Obviously, even where special configurations of such thin section are used, or where such attenuation or velocity shift line broadening can otherwise be tolerated, the very long response times resulting from the use of such energy generally indicates its undesirability for such device use. Accordingly, where this material is used, it is generally desirable to filter out or otherwise avoid light of a wavelength smaller than about 5200 A. The spectral response of cadmium sulfide or any other photoresistive material of course varies according to the nature and amount of any additives included for the purpose of tailoring photoresponse. Nevertheless, most materials have a generally typical spectral response, values for which are available. In cadmium sulfide, light emission ranging from about 5200 A. down to infrared in the range of from 8000 to 9000 A. wavelength is generally suitable, with a preference generally existing for frequencies corresponding with a 5000 to 7000 A. wavelength.

Regardless of the use to which the device is to be put, it is necessary to choose a composition which results in a particular relative attenuation or ultrasonic velocity (FIG. 2) corresponding to a particular frequency or frequencies of operation. Where the conductivity is to be modulated during use it is also required to choose this composition such that the proper swing in the pertinent characteristic is producible for the available variation in modulating means. Again referring to cadmium sulfide as exemplary of that class of piezoelectric materials having a light modulated conductivity mechanism, the necessary information is already available in the form of reported dark and light resistivities for particular compositions. Referring, for example, to the Journal of Chemical Physics, vol. 23, No. 1, pages 15 et seq. (January 1955), Table I, there is presented a listing of such resistivity values for chloride, copper, aluminum, gallium and indium containing cadmium sulfides for various quantitative additions. Assuming a device design such that the maximum attenuation or velocity change is to occur at a given frequency, such frequency value may be determined by setting the abscissa quantity of FIG. 2, $\epsilon^S/4\pi\sigma$ equal to 1, and substituting appropriate $\sigma$ quantities ($\sigma=1/\rho$). As an example, selecting a 10 p.p.m. aluminum-containing cadmium sulfide evidencing dark and light resistivities of $10^{12}$ and $10^8$ ohm-cm., respectively, and for $K^S$ equal to 9 (cadmium sulfide):

$$\frac{\omega\epsilon^S}{4\pi\sigma}=\frac{2\pi f\epsilon^S}{4\pi\sigma}=\frac{f\epsilon^S}{2\sigma}=\frac{f\epsilon^S\rho}{2}=1$$

and since $\epsilon^S=9$, $$f=\frac{2}{9\rho}, \text{ with } \rho \text{ in stat ohm-cms.}$$

or $$=\frac{2\times 20^{+11}}{\rho}, \text{ with } \rho \text{ expressed in ohm-cms.}$$

It is seen, therefore, that for the particular composition chosen, peak attenuation occurs at a frequency of 0.2 cycle per second in the dark and $2\times10^3$ cycles per second at saturation. For 50 p.p.m. of aluminum, also in cadmium sulfide, the frequency range of dark to light extends from $2\times10^3$ to $10^8$ cycles per second. These two compositions together therefore offer a frequency range of from 0.2 to $10^8$ cycles per second.

Particular uses dictate selection of special compositions. Operating with the particular exemplary cadmium sulfide system, use of either of the compositions alluded to in the preceding paragraph may result in undue sensitivity to illumination intensity. This sensitivity may be decreased by choosing a composition evidencing a narrower swing in resistivity from dark to light.

Where it is desired to amplitude modulate an acoustic signal, or to operate the device as a switch, it may be desirable to select a composition having a dark resistivity approximately an order of magnitude away from the peak attenuation point so that a relatively low level light intensity is required to produce a measurable change in attenuation or velocity.

Where the device is to be operated as a narrow band rejection filter, choice of material is carried out in the manner discussed above. Where it is to be used as a band pass filter, two or more such devices may be used in combination, or different doping levels and/or additives may be utilized over different portions of the same ultrasonic element so as to produce two or more peaks in attenuation such as that depicted on Curve 31 of FIG. 2. Where the band pass filter is to reject all frequencies within a given operating range above and below the band pass frequency, and where the natural rejection peak is not sufficiently broad, it may be broadened either by using a gradation of the same impurity or by varying the type of additive so as to produce, in effect, a large or infinite number of peaks over the unwanted frequency band or bands.

The invention has been discussed largely in terms of preferred use of a conductivity-modulable piezoelectric ultrasonic element and generally also in terms of devices in which the conductivity is adjusted or modulated in use. Designs not making use of such variation have, however, also been discussed, and it is therefore considered that the inventive scope is sufficiently broad to include not only devices utilizing piezoelectric ultrasonic elements in which the conductivity is varied through photoconductivity or other mechanism, but also to include devices in which the conductivity is modulated through selection of composition so as to result in a device having a static attenuation or velocity characteristic and, therefore, to operate in such manner as to be frequency selective alone. It is considered that the inventive concept encompasses all devices utilizing ultrasonic elements in which selection, adjustment, or variation of conductivity brings about an alteration in the ultrasonic signal transmitted through the piezoelectric mechanism. Rejection filters, band pass filters, switches, modulators and other devices have been discusesd. Additional devices making use of this novel principle will be evident to those skilled in the art and are considered also to be within the scope of this invention.

What is claimed is:

1. A circuit element comprising in succession a first piezoelectric transducer, a conductivity modulable piezoelectric ultrasonic transmitting element of a material having a maximum room temperature resistivity of $10^{12}$ ohm-cm., the resistivity of the said material being in part dependent upon the amount of radiation impinging thereon, and a second piezoelectric transducer so arranged that an electric field applied across the said first piezoelectric transducer results in an ultrasonic signal which is transmitted through the said ultrasonic transmitting element and into the second piezoelectric transducer, so resulting in an electrical field across the said second transducer, and in which the direction of ultrasonic propagation through the said ultrasonic element is such as to result in a piezoelectric field in that element together with means for varying the illumination incident on a surface of the said ultrasonic transmitting element in such manner as to vary the electrical resistivity, the variation in electrical resistivity resulting in an attendant change in the velocity of propagation of an ultrasonic wave through the said ultrasonic element.

2. The device of claim 1 in which the said material consists essentially of cadmium sulfide, and in which the said illuminating means is designed to emit light within the 5000 to 7000 A. wavelength range.

References Cited in the file of this patent

UNITED STATES PATENTS

| | | |
|---|---|---|
| 2,484,636 | Mason | Oct. 11, 1949 |
| 2,839,731 | McSkimin | June 17, 1958 |
| 2,917,669 | Yando | Dec. 15, 1959 |
| 3,012,211 | Mason | Dec. 5, 1961 |
| 3,035,200 | Yando | May 15, 1962 |